United States Patent [19]

Tributsch et al.

[11] Patent Number: 4,700,311

[45] Date of Patent: Oct. 13, 1987

[54] SYSTEM FOR OPTIMIZING PROCESS PARAMETERS IN PHOTOACTIVE SEMICONDUCTOR MANUFACTURING IN-SITU

[75] Inventors: Helmut Tributsch; Gerhard Beck; Marinus Kunst; Udo Küppers; Hans-Joachim Lewerenz; Jochen Lilie; Andre Werner, all of Berlin, Fed. Rep. of Germany

[73] Assignee: Hahn-Meitner-Institut für Kernforschung Berlin GmbH, Fed. Rep. of Germany

[21] Appl. No.: 694,932

[22] Filed: Jan. 25, 1985

[30] Foreign Application Priority Data

Jan. 25, 1984 [DE] Fed. Rep. of Germany ....... 3402822

[51] Int. Cl.⁴ .................... H01L 21/66; H01L 31/18; C30B 25/16
[52] U.S. Cl. .................................. 364/468; 156/627; 427/74
[58] Field of Search ................. 156/626, 627; 364/468; 427/8, 74

[56] References Cited

U.S. PATENT DOCUMENTS 3,982,049  9/1976  Mee et al. .......................... 427/128
4,332,833  6/1982  Aspnes et al. ......................... 427/8
4,525,375  6/1985  Hanak ..................................... 427/8

OTHER PUBLICATIONS

Riber R.H.E.E.D. System, Riber S.A., Ruel-Malmaison, France, Oct. 1975.
Kunst, M. et al., "Time-Resolved Microwave Conductivity (TRMC): Photoeffects at Semiconductor/Electrolyte Interfaces", Journal of the Electrochemical Society, vol. 131, No. 4, Apr. 1984, 954–956.

Primary Examiner—Jerry Smith
Assistant Examiner—Clark A. Jablon
Attorney, Agent, or Firm—McGlew and Tuttle

[57] ABSTRACT

Materials and systems substantially having photoactive properties are produced with a high quality output and without time losses in the fabrication process. To determine the quality of the photoactive material in situ, conductivity is induced in the material by exciting charge carriers through irradiation, and an electromagnetic field influenced thereby is measured, with the result of the measurement being evaluated by a computer with a corresponding control of actuating members such as valves and controllers. Optimum process parameters are thus found and used for the process.

7 Claims, 17 Drawing Figures

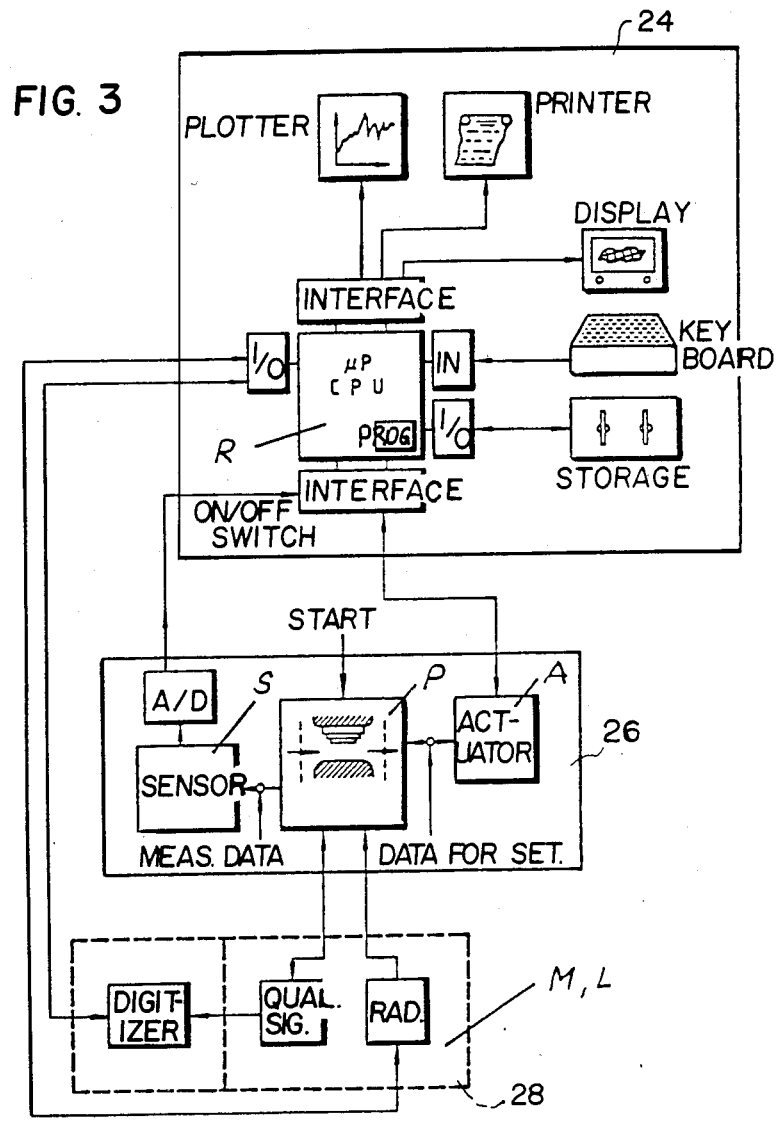

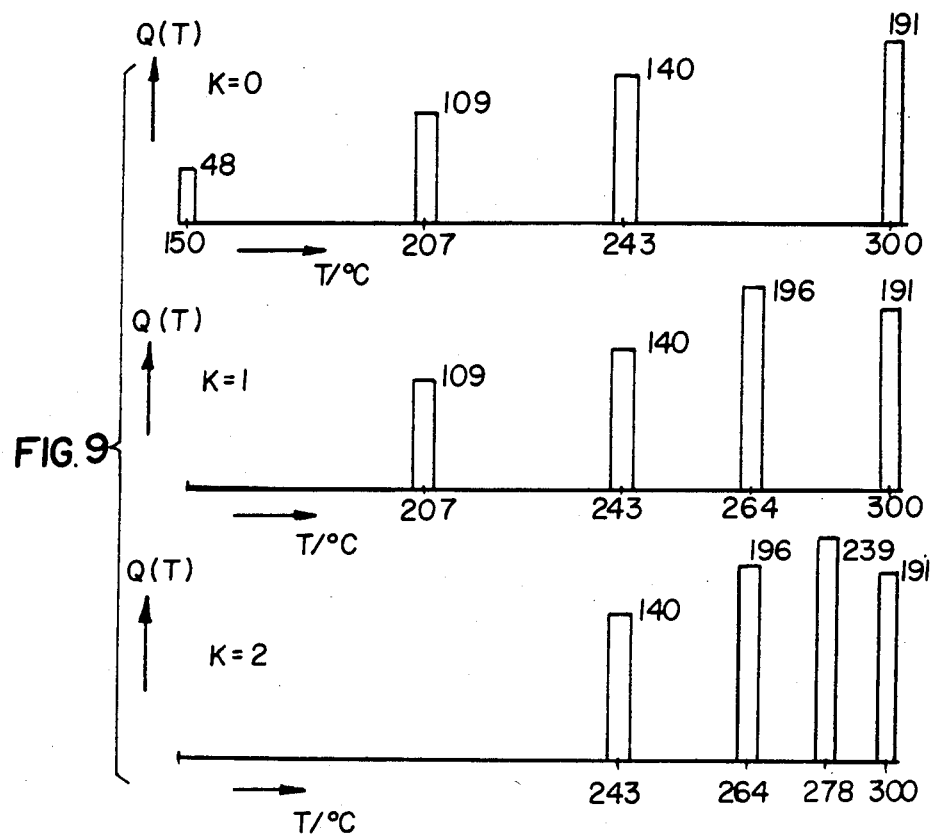
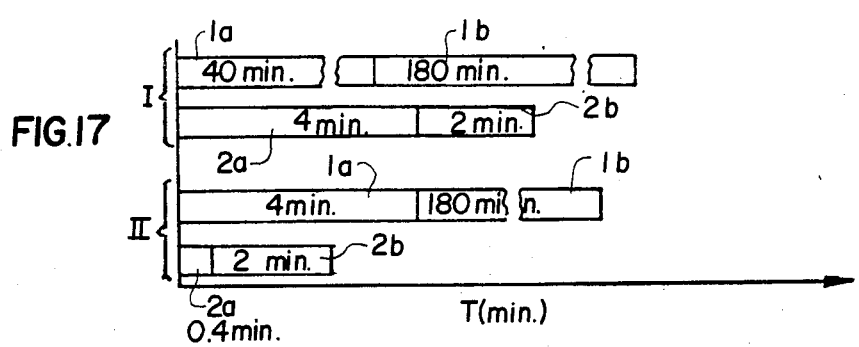

SYSTEM FOR OPTIMIZING PROCESS PARAMETERS IN PHOTOACTIVE SEMICONDUCTOR MANUFACTURING IN-SITU

FIELD AND BACKGROUND OF THE INVENTION

The present invention relates in general to semiconductor fabrication techniques and in particular to a new and useful method of making semiconductor materials or semiconductor components wherein the setting of process parameters is based on material properties which are measured during the process.

Prior art which is relevant to the present invention can be found in the publication "Riber R.H.E.E.D. System", October 1975 by the company Riber S. A., Ruel-Malmaison, France. That system provides corresponding sensors and actuators for pressure, temperature, and other process parameters. To what extent a process actually goes or went on in the desired way, may be learned, for example in processes such as film formation by growing poly-of monocrystaline layers, by in-situ monitoring of the surface texture by means of electron beam deflection patterns. Then, upon visualizing the results on a luminous screen, the parameters may be varied empirically, to optimize the process.

A substantial problem arising with attempts to make the process automatic is to find or select an effect particularly characteristic of the intermediate product or the finished part and capable of being measured under conditions of automatic operation thus permitting a correct interpretation of the relationship between varying measured data and the process parameters, and permitting the making of correct decisions. Finally, a computer system must be provided and correspondingly programmed.

SUMMARY OF THE INVENTION

The present invention is aimed at optimizing the fabrication of photo-active materials and systems, i.e. particularly, ensuring a higher quality and output, and eliminating time losses, by providing in-situ measurements.

Accordingly, an object of the present invention is to provide a method of making semiconductor materials and semiconductor components wherein the setting of process parameters is based on material properties measured in-situ, characterized in that the materials and/or components substantially exhibit photo-active properties and, during their process of formation, are repeatedly exposed to irradiation to excite charge carriers. Variations of an electromagnetic field resulting from the conductivity induced in the photo-active material by the charge carriers excitation are measured and the measured data are supplied to, and evaluated in, a computer. The process parameters are controlled to an optimum extent through control and measuring members which are coupled to each other through the computer.

What is substantial and advantageous is that with the inventive method, the quality can be monitored without interrupting the fabrication process, that the needed corrections of the process parameters become effective instantly, and that the specific effects of these corrections are automatically and optimally combined with each other to the desired total effect. In addition, such combinations are not limited to empirically acquired data. The learning and record keeping capability of the computer makes it possible to use the available spectrum of parameter combinations to automatically determine and select the optimum conditions.

It is of fundamental importance to the invention, that photoactive materials or components are concerned whose photoconductivity can be measured without thereby unfavorably affecting the process conditions. This is advantageously done with a contact free measuring method. Particularly suitable in this respect are microwave measurements known per se and recently applied at a growing rate for testing of various semiconductor systems. The photosensitivity is measured for example in time resolution, also if measuring is effected through electrical contacts placed on the substrate before the coating process, by a contactless excitation of charge carriers, such as with a small mobility of the charge carriers, quality signals of this kind, measured through microwave absorption (TRMC) or directly as photoconductivity (PC), are equivalent to each other. Which of these measuring methods to apply depends on the respective technical conditions.

Other embodiments of the invention use light radiation. Such use mainly relates to in-situ measurements in marginal conditions as well as to the general conduction of the process where quite different conditions possibly unfavorably affecting each other are to be observed in the individual stages. Multichamber systems, for example, may be provided in such instances, to create unequal conditions of temperature, pressure, gas composition, longer or shorter dwell, local fixing for a certain time of the product, rotary motion, etc. The transfer times from one working step to the other should be reduced to a minimum, to ensure a continuous process with a conveyance which, taking into account the above-mentioned variations, might better be termed quasi-continuous.

Another object of the invention is to provide an apparatus suitable for practicing the method.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

Details of the invention and embodiments thereof are diagrammatically shown in the drawings in which:

FIG. 3 is a diagram illustrating the basic design of an apparatus for a computer aided optimization of the inventive process (CAPO-apparatus);

FIG. 9 is a bar chart showing a three-step interval narrowing operation during the search for an optimum parameter (Fibonacci search);

FIG. 17 is a bar chart comparing the time needed for the different processes.

DESCRIPTION OF THE PREFERRED EMBODIMENTS

Figure 1:
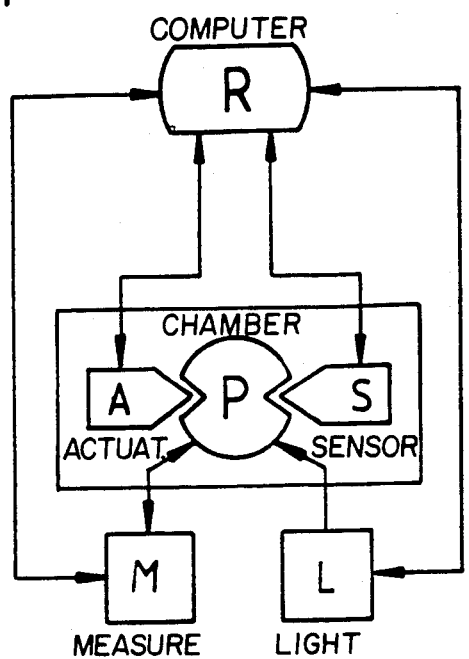
FIG. 1 is a diagram illustrating the principle of an apparatus for carrying out the inventive method.

An apparatus for carrying out the inventive fabricating method comprises the parts shown as blocks in FIG. 1, which are operatively interconnected as indicated by arrows. The fabrication of photosensitive materials or systems, particularly components, which may also consist of an improvement of a given material, takes place in a process chamber P. Even a plurality of process chambers P may be provided. The properties of the photosensitive material or system in process chamber P are determined as quality signals by means of a measuring device M. To this end, the material or system in chamber P is irradiated from the outside, in the present example by a source of light L. A computer R receives measurement signals from both measuring device M and sensors S, evaluates them, computes the parameter values for the next operations, and correspondingly controls particularly the control member or actuators A. This makes of the apparatus a fully automatically operating control circuit closed in itself.

The adjustment or setting of actuators A for an optimum progress of the operation is continuously kept up. In particular, new combinations of operational parameters may be found during the fabrication of conventional or new kinds of photosensitive materials or systems, which then lead to higher material qualities.

Figure 2:
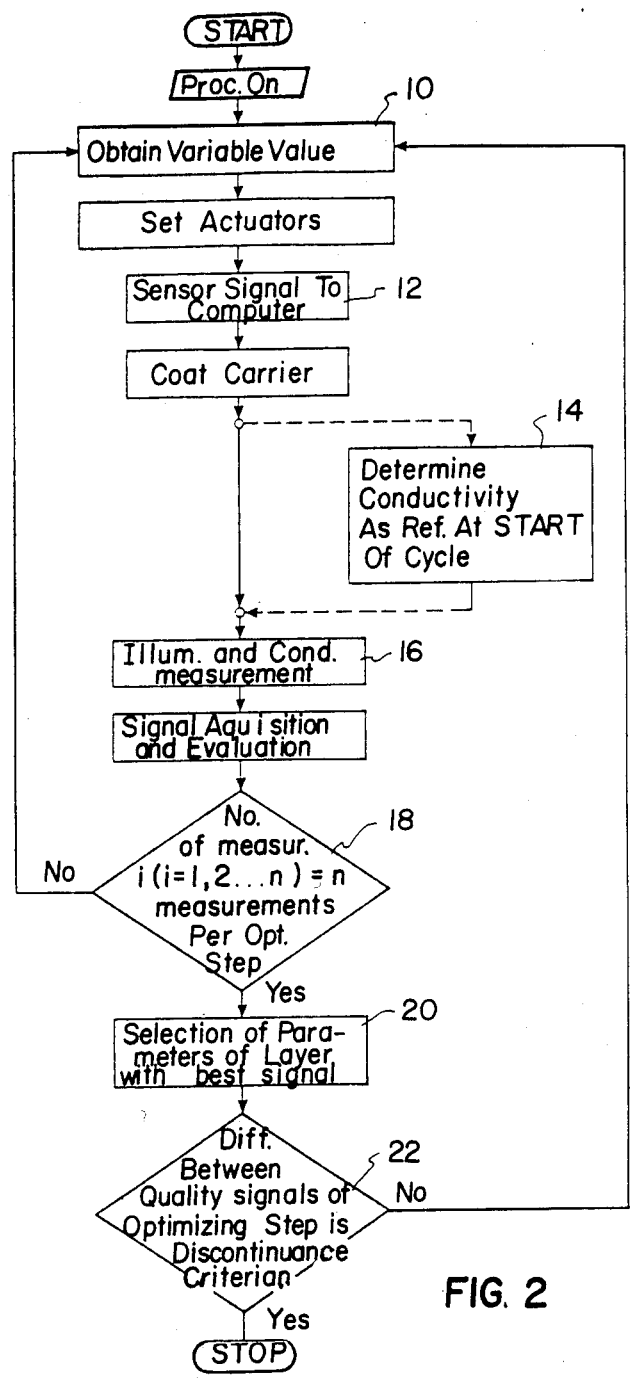
FIG. 2 is a flowchart of an operating step under the strategy of optimization.

The development of a working step within the optimization strategy is illustrated in detail in FIG. 2.

As shown in FIG. 2, a process start signal establishes a process on condition. At box 10, variable values of process parameters obtained through the optimization strategy of the invention are selected. Initial conditions can be used at first.

The actuators A are then set in accordance with the parameter values of box 10. Box 12 shows the step of applying sensor signals to the computer whereafter coating of the substrate carrier takes place. For the start of a new working cycle, box 14 illustrates the step of determining conductivity using for example, the TRMC or PC methods as a reference at the start of a new working cycle. This for example is after a long interruption or after n optimization steps. Illumination and conductivity measurement then takes place as shown in box 16, followed by signal aquisition evaluation.

A first interrogation shown at diamond 18 counts the number of measurements i which is in integer from 1 to n. If the integer has not yet reached the value n the process returns to the step of box 10. n is the number of measurements per optimization step or per generation.

When the integer has reached the value n, the step shown in box 20 is executed which is the selection of a parameter combination for the layer having best quality signal.

A second interrogation at 22 determines the difference between the quality signals of the optimization steps or generations which establishes discontinuance criterian. Once this has been reached, the process stops.

FIG. 3 shows a basic concept of a test apparatus for a computer aided process optimization (CAPO). The individual parts are indicated by the reference letters according to FIG. 1, and some peripheral devices of computer R are shown. Such an apparatus is suitable particularly for determining process conditions in the fabrication of new kinds of photosensitive materials.

FIG. 3 shows a computing assembly 24 which includes computer or CPU R. This is connected through interfaces, input or input/output devices to a curve drawing recorder, a printer, a display unit which, for example can be a CRT, a keyboard and a memory storage facility which may, for example, be a floppy disc device. The CPU contains a program for the optimization strategy of the invention.

The computing circuit 24 is connected to a process unit 26 which includes the chamber P, the actuators A, the sensors S. Sensors S are connected through an analog to digital converter to one of the interfaces of the computer R. Actuator A is also connected through this interface to the computer.

Measured data taken from the chamber is applied to the signal for the sensors and data for setting the actuators is applied to the actuators for modifying their effect on the chamber.

An illumination and measurement unit 28 is connected to the process unit 26 and includes the source of irradiation L, the measuring unit M and a digitizer for connecting the measuring unit the computer through an input/output device.

EXAMPLE 1

Producing Amorphous Silicon Layers For Solar Cells

Amorphous silicon, a-Si, may be produced in a glow discharge by decomposing silane, $SiH_4$. The particular process parameters are: pressure in the deposition chamber, substrate temperature, and rate of flow of a gas or gas mixture. The actuators A, such as valves and heating controllers, are adjusted, and the quality and sensor signals are collected and evaluated in or by the computer R. At the same time, the signal and magnitude of the variations of the process parameters are determined, and optimized in accordance with rules of experimentation of optimizing strategies. The corresponding measured quantity is the conductivity variation in the a-Si layer. This variation is determined by microwave measurement, for example, which is based on the proportionality between $\Delta P$, the microwave absorption variation and $\Delta\sigma$, the conductivity variation due to excitation of charge carriers.

EXAMPLE 2

Producing a Photoconductive Polymer Layer

Figure 4:
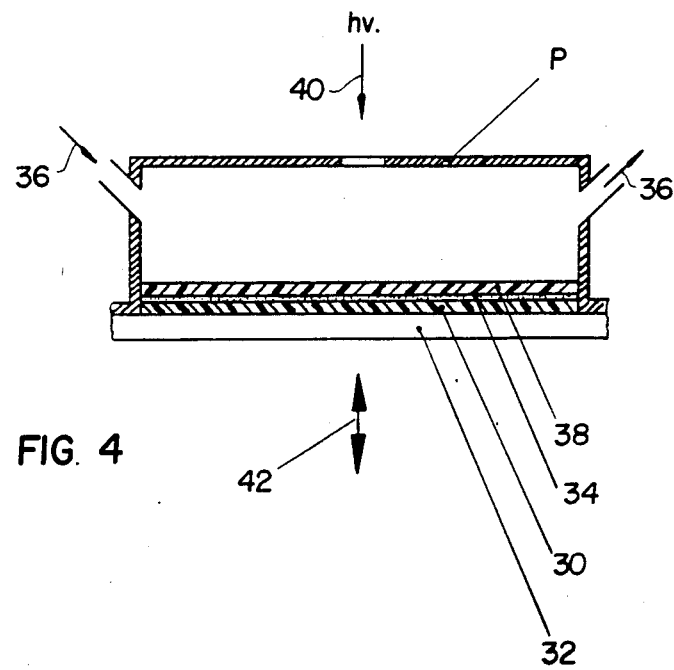
FIG. 4 is a cross sectional view of a reaction chamber serving as a momentaneous receiver during an operation.

The process is conducted in an apparatus according to FIG. 4. FIG. 4 shows, in a sectional view, a reaction or process chamber P for this example serving as a momentaneous receiver during the process. A contacted foil of plastic 30 is fixed to a substrate 32 of glass for example. The foil is coated with a catalyst 34, such as the Ziegler-Natta-Catalysts. A monomer, for example acetylene, is directed at 36 through chamber P. The reaction with the catalyst results in polyacetylene which deposits as a polymer layer 38. The coating takes place under light irradiation applied at 40.

To optimize this process, again charge carriers are excited by incident light at 42 and microwave measurement (also at 42) is used as in the first example.

EXAMPLE 3

Improving a Surface

A photosensitive substrate is to be provided with a surface improving layer to satisfy predetermined quality requirements. The optimum composition and thickness of this layer are obtained, in accordance with the predetermined requirements, by means of an apparatus of FIG. 3. Produced may be, for example, an antireflection layer, a passivating layer for an optoelectronic component, an anticorrosive layer, etc.

EXAMPLE 4

Electrochemical Deposition of a Layer

Process chamber P is designed as an electrochemical cell. Layers are deposited in accordance with the adjusted process parameters, so that they form optimally, i.e. satisfy the predetermined requirements.

EXAMPLE 5

Producing Energy Converting Boundary Layers, For Example for a P-N Solar Cell In a process chamber P, an n-type layer is deposited on a p-type layer. The variation in time of the microwave absorption is measured. Here again, the variation of the induced conductivity caused by irradiation from the outside and excitation of the charge carriers in the produced layers, is the optimization measure.

Figure 5:
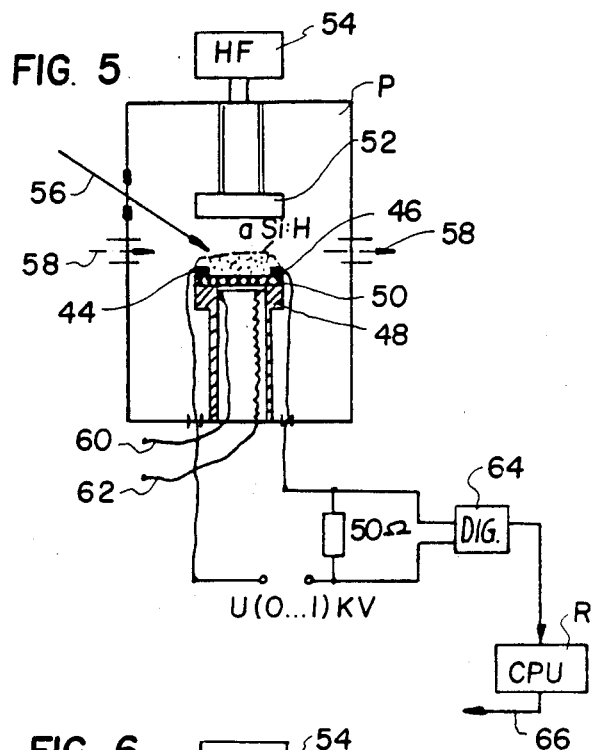
FIG. 5 is a diagram illustrating the basic design of the plasma deposition apparatus with PC measuring equipment.
Figure 6:
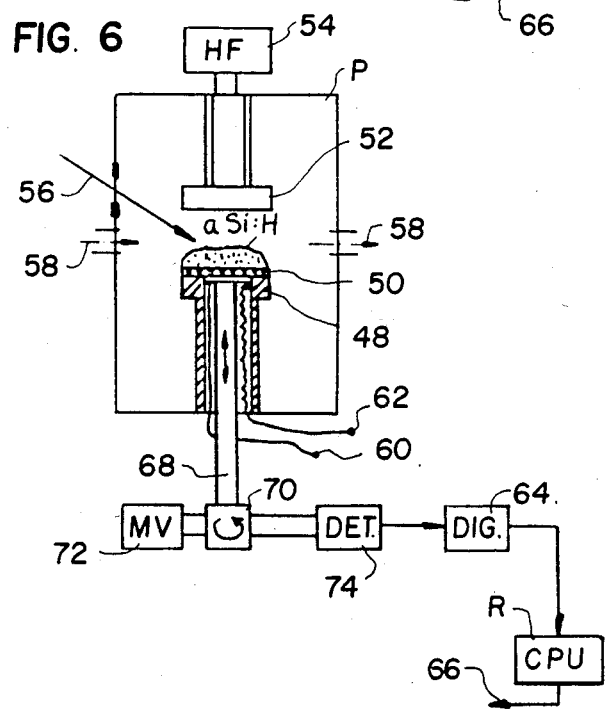
FIG. 6 is a diagram illustrating the basic design of the plasma deposition apparatus with microwave measuring equipment.

The plasma deposition apparatus shown in FIGS. 5 and 6, are substantially identical with each other. Only the measuring equipment connected thereto are different. In the apparatus according to FIG. 5, the photoconductivity is measured directly through contacts 44, 46 which must be fixed to the substrate carrier 48 in advance, prior to the coating. The apparatus according to FIG. 6 is equipped with a microwave measuring system.

In FIGS. 5 and 6 the same reference numerals are used to designate the same or similar elements.

A substrate which is for example, of quartz is provided at 50 on the carrier 48. The carrier acts as electrode which cooperates with counterelectrode 52 that is powered by a high frequency generator 54. The coating is irradiated by a laser pulse at 56 through a window in chamber P. Silan is supplied and discharged to and from the chamber at 58. Temperature is measured by a thermocouple on a lead 60 and the heating is provided by a heating conductor 62.

In the embodiment of FIG. 5, the conductivity measurement taken across contacts 44, 46 are applied to a digitizer 64 which digitizes the analog signal and applies it to computer R which generates signals on a line 66 for application to the actuators.

In the embodiment of FIG. 6, no measuring contacts are used. Rather, waveguide 68 transmits and receives microwaves to and from substrate 50. The light irradiation is transmitted from a microwave source 72 through a circulator 70 and from circulator 70 to a detector 74. The signal of detector 74 is applied through digitizer 64 to computer R which generates the actuator signals on line 66. Other elements of FIG. 6 have the same function as those shown in FIG. 5.

Specifically, such an apparatus comprises the following devices:

| | |
|---|---|
| Computer: | micro PDP 11, Company DEC |
| Terminal: | company DEC |
| Process chamber: | Vacuum system: Balzers TSU 171 |
| | Pumps: Leybold TM 230 |
| | Pressure sensors: PM 410 |
| | HF components: Kenwood TS 530, AT 230 |
| | Flowmeters: MKS 260, 264A, 260 PS-2 |
| | Temperature controllers: Eurotherm Type 820 |
| | Power supply: SM 6020 Electronic |
| Irradiation source: | Nd-Yag-Laser, pulse duration 10 ns |
| | Wavelengths: 1064 nm and 532 nm |
| Measuring equipment: | Microwave components from the companies Hughes, USA; Mid-Centry, GB, Waveline, USA |
| Digitizer: | AD 7912, Textronix |

With an apparatus of this kind, a single-dimension in-situ optimization has been conducted in accordance with the Fibonacci search, with the temperature as the variable.

Figure 7:
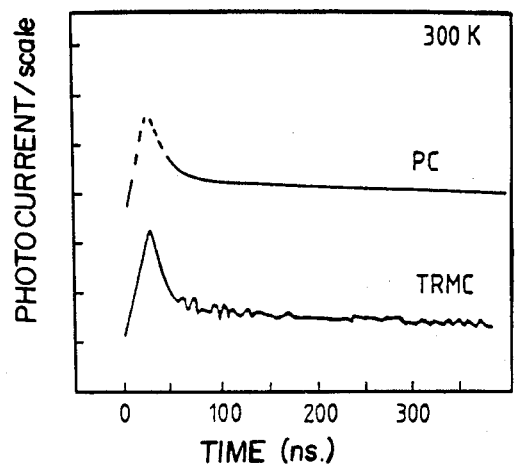
FIG. 7 is a graph showing the equivalence of PC and TRMC signals (photocurrent against time, at a constant temperature)
Figure 8:
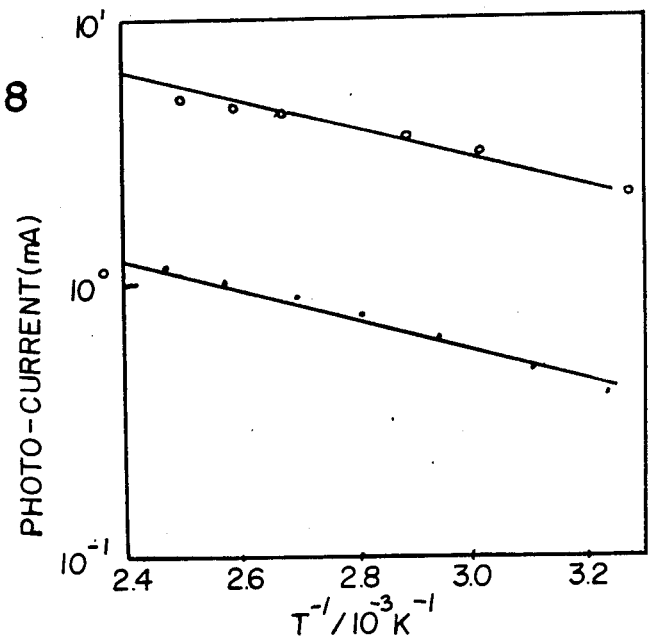
FIG. 8 is a graph showing the equivalence of PC and TRMC signals (photocurrent against temperature)

Under certain conditions, particularly of a small charge carrier mobility, the quality signals obtainable with the microwave measuring apparatus are equivalent to those obtained with the photoconductivity measurement according to FIG. 5, as may be learned from FIGS. 7 and 8.

FIG. 9 illustrates the employed strategy. The predetermined search region was within the temperature limits of 150° C. and 300° C.

It was known from the literature that within this interval, the best layer qualities can be produced. The other process parameters were maintained constant:

| | |
|---|---|
| Rate of Flow V: | 5 sccm (standard cubic centimeters per minute) |
| Pressure P: | 0.6 mbar = 0.6 hPa |
| HF-power $P_{HF}$: | 3 watt |

By separate consecutive steps, the search region has been narrowed until an optimum with a predetermined interval of uncertainty was reached. Within the starting interval K=0, the minimum step is Tmin=50° C. The measured qualities showed that in any case, temperatures below 207° C. can be eliminated. During the next step K=1, a measured quality of 196 was found. Therefrom it could be next to inferred that below 264° C., the qualities are lower, and that also below 243° C., no higher quality can be expected than 264° C. What had to be found out further was only whether higher qualities than 196 occur above or below 264° C. In step K=2, at 278° C. the quality of 239, the maximum of all measurements heretofore, was measured. At this, the search interval narrowing was interrupted by the computer and the temperature of 278° C. which was already short of the predetermined interval of uncertainty, has been accepted as the optimum.

Figure 10:
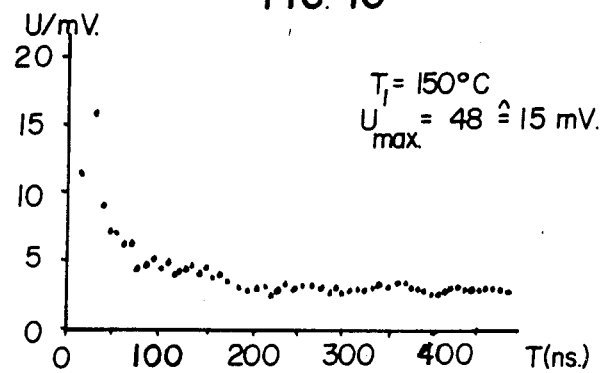
FIGS. 10, 11 and 12 are graphs of photovoltages measured during the search according to FIG. 9.
Figure 11:
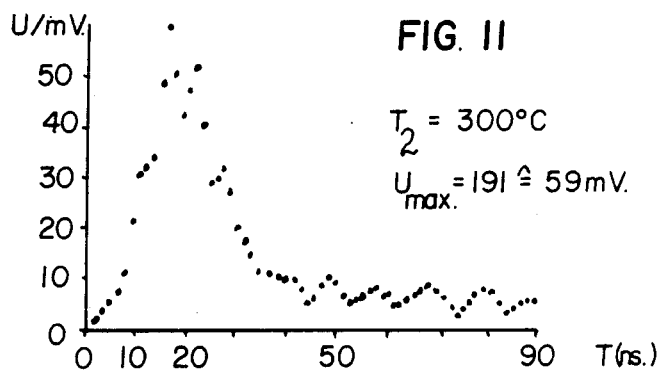
Figure 12:
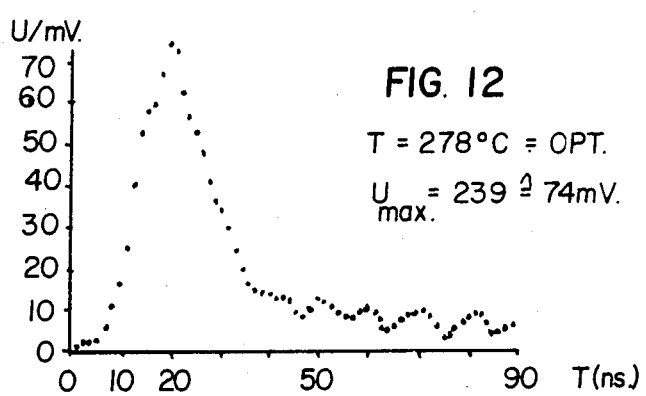

In FIGS. 10, 11 and 12, the qualities measured within the search steps K=0 to K=2 according to FIG. 9 are plotted as photovoltage against time at temperatures $T_1=150°$ C. (FIG. 10); $T_2=300°$ C. (FIG. 11); and $T_{opt}=278°$ C. (FIG. 12). The above indicated numbers are readings of the respective scale and correspond to certain voltages, the exact values of which, however, are not too important in the determination of an optimum. The computer processes the readings of the scale. Thus, in the CAPO process, an optimum was found after three cycles and six quality measurements.

A time resolved microwave conductivity (TRMC) measurment is of particularly importance in photoelectrochemical process too. Here again, generation of charge carriers and their transport, and variation of the conductivity of the liquid photosensitive medium are responsive to an irradiation with light pulses and are measured through the microwave absorption. What is of interest is what happens at the interface between a semiconductor and a liquid electrolyte. In accordance therewith, the conductivity variation comprises two parts, namely the induced conductivity of the ions and carriers of electric charges, and the conductivity due to an absorption of electric energy from induced dipoles. To this see "J. Electrochem. Soc." Vol. 131, No. 4, April 1984, pages 954 to 956 by Kunst, Beck and Tributsch. This article, which is by three of the present co-inventors, was published only after the present invention was made.

From this article it can be seen that the teaching of the present invention is applicable not only to a photoactive material in solid state systems, but also to the fabrication of photoelectric chemical solar cells.

Figure 13:
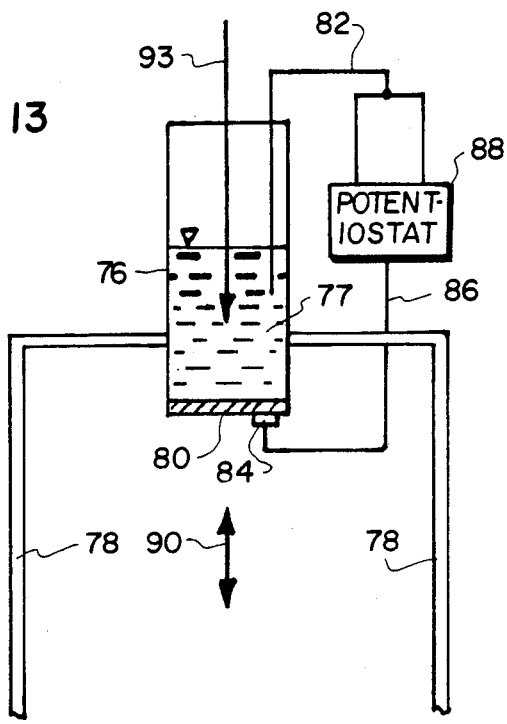
FIG. 13 is a diagram illustrating the basic design of microwave measuring equipment of a photoactive electrochemical system.

In this respect, FIG. 13 shows a design comprising an electrochemical cell 77 enclosed in a plastic tube 76 which is centrally screwed into a short circuited waveguide 78 of the Kα band. A semiconductor working electrode 80 forms the bottom cell closing the plastic tube 76. A platinum wire 82 serves as the counterelectrode, and a K$_2$SO$_4$ solution is employed as the liquid electrolyte in chamber 77.

Platinum wire 82 also acts as a reference electrode. Wire 82 is connected to a potentiostat 88 and electrode 80 is connected through an ohmic contact 84 and wire 86 to the potentiostat 88. Microwaves are applied and measured at 90, the microwaves being Kα band of 26 to 40 GHz. Laser light is applied at 93, in pulses from a Nd-Yag-Laser having a pulse duration of 10 ns and a wavelength of 530 nm.

Figure 14:
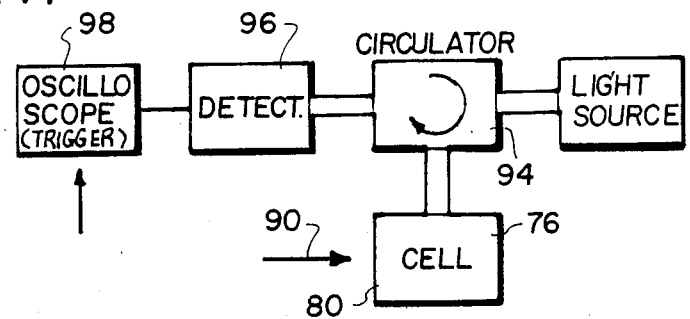
FIG. 14 is a block diagram of microwave measuring equipment.

According to FIG. 14, in the waveguide system, microwaves of the region 26 GHz to 40 GHz, for example 30 GHz, are directed from the outside against a semiconductor electrode 80 of a cell 76, which extends transversely to the wave propagation. The microwaves which are reflected from the interface between the semiconductor and the liquid electrolyte, pass through a directional coupler or circulator 94 to the detector 96. The output signal of the detector is proportional to the microwave power variation, at least within the low power range, and is recorded after excitation as a function of time in triggering oscilloscope 98.

Figure 15:
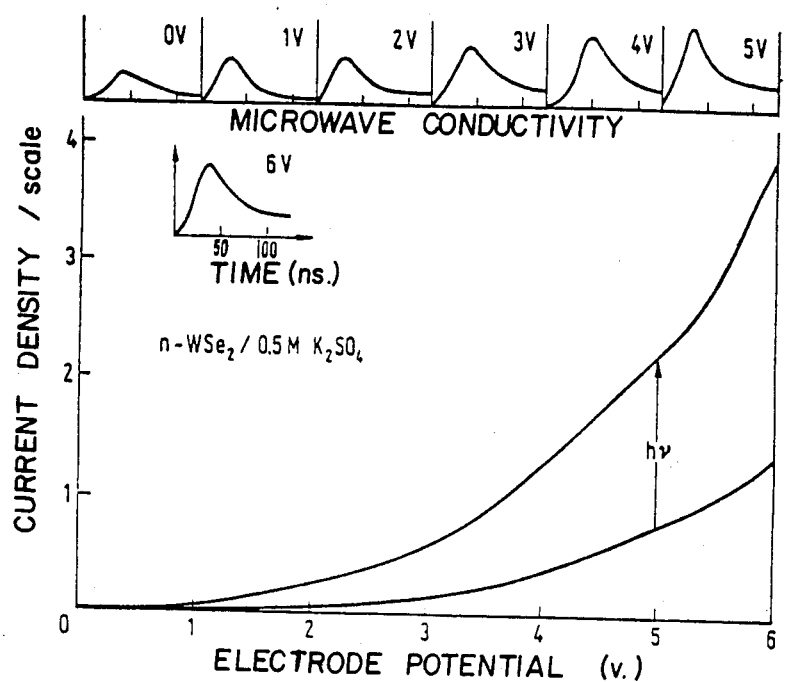
FIG. 15 is a multipart graph showing the variation of the photocurrent and the dark current for the system according to FIG. 13.
Figure 16:
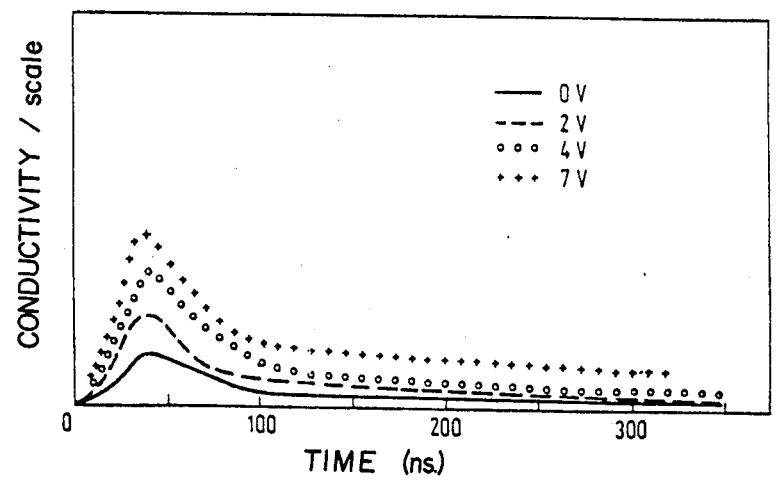
FIG. 16 is a graph showing the variation of the induced microwave conductivity plotted against time, for different electrode potentials, in the system according to FIG. 13.

FIGS. 15 and 16 show curves of such measurments. It appears that with an increasing electrode potential, up to 6 volts the photocurrent increases progressively, without saturation. The induced conductivity initially decreases rapidly (the decay time is partly determined by the laser pulse). Then, the conductivity decrease slows down.

The time scales shown in FIG. 17 are to demonstrate that time can be saved with the inventive method, as compared to prior art in-situ measurements. This does not yet take into account time reductions resulting from a fully automatic optimizing process, thus, for example, such becoming manifest as a higher output and a faster sequence of the individual working steps. Another advantage is the higher quality standard achievable with the inventive method, which is also a weighty factor, even if in another connection.

Typical working steps 1a, 1b, 2a, 2b, for example while forming an a Si:H-layer, comprise the following measures:

Conventional method (1a, 1b in FIG. 17)

1a: Deposition; typical layer thickness: d=5,000 (Å) used rate of deposition $r_d$ for:
  I: Monosilane—SiH$_4$: $r_d=1 \ldots 3$ (Å/s) results in (strip I.1a=) 40 min.
  II. Disilane—Si$_2$H$_6$: $r_d=15 \ldots 30$ (Å/s) results in (step II.1a=) 4 min.

1b. Switching off the apparatus, ventilation, sampling, contacting, measuring, evaluation, introducing a new substrate, setting the initial conditions, starting a new layer deposition:
result in (strips I.2a×II.2a=) 180 min.

Present method (2a, 2b in FIG. 17)

2a: Deposition; typical layer thickness: d=500 (Å) (this is the minimum layer thickness to obtain a quality signal) used rate of deposition $r_d$ (as mentioned above) for:
  I: Monosilane—SiH$_4$: $r_d=1 \ldots 3$ (Å/s) results in (strip I.2a=) 4 min.
  II. Disilane—Si$_2$H$_6$: $r_d=15 \ldots 30$ (Å/s) results in (strip II.2a=) 0.4 min.

2b: Illumination (i.e. irradiation), determining the quality during the flow discharge, transmitting the measurment signal, processing in the computer, adjusting the actuators, starting a new layer deposition (i.e. continuation of layer deposition with new setted actuators):
result in (strips I.2b=II.2b=) 2 min.

(The quality is determined in-situ through a time-resolved microwave conductivity measurment—TRMC—or photoconductivity measurment—PC—, as noted above.).

The strips I.1a, I.2a, and II.1a, II.2a in FIG. 17 relate to average deposition rates $r_d$ of 2 Å/s for Monosilane (I) and of 20 Å/s for Disilane (II). It can be seen therefrom that:

$$t(I.1a+I.1b)=220 \text{ min}=t(I.1)$$

$$t(I.2a+I.2b)=6 \text{ min}=t(I.2)$$

and $$\frac{t(I \cdot 1)}{t(I \cdot 2)} = \frac{36.7}{1}$$

$$t(II.1a+II.1b)=184 \text{ min}=t(II.1)$$

$$t(II.2a+II.2b)=2.4 \text{ min}=t(II.2)$$

and $$\frac{t(II\cdot 1)}{t(II\cdot 2)} + \frac{76.7}{1}$$

which is, in any case, a remarkable saving in time of the present invention over the prior art.

While specific embodiments of the invention have been shown and described in detail to illustrate the application of the principles of the invention, it will be understood that the invention may be embodied otherwise without departing from such principles.

What is claimed is:

1. A method for optimizing process parameters in photoactive semiconductor manufacuring, comprising:
   (a) continuously forming a layer of semiconductor material which exhibits photoactive properties, the layer growing on a substrate under conditions of controllable process parameters;
   (b) exposing the growing layer in situ and during the forming step, to an electromagnetic field;
   (c) repeatedly irradiating the growing layer to excite charge carriers therein, the excitation of charge carriers, inducing a photoconductivity which directly relates to the photoactive property of the growing material and produces variations in the electromagnetic field interacting with the material exposed to it;
   (d) measuring the variations of the electromagnetic field to generate measured data;
   (e) supplying to and evaluating in a computer, the measured data;
   (f) generating signals by the computer corresponding to the optimum photoactive property of the material as it is growing for use in controlling the process parameters;
   (g) changing one of the process parameters according to the signals, and
   (h) repeating the steps (c) through (g) a plurality of times, while maintaining the steps (a) and (b), to generate additional measured data for supplying the evaluating in the computer to successively determine and use optimized process parameters all within the period of time needed for forming the entire layer.

2. A method according to claim 1, including exposing the material with lightwave.

3. A method according to claim 2, including irradiating the material with white light.

4. A method according to claim 2, including irradiating the material with monochromatic light.

5. A method according to claim 1, including using contacts attached to the material for measuring photoconductivity directly.

6. A method according to claim 1, including exposing the material with electrons.

7. A method according to claim 1, including exposing the material to microwaves and using a waveguide for supplying said microwaves to and for measuring variations of said microwaves produced by said excited charge carriers in the material by way of a contactless manner.

* * * * *

UNITED STATES PATENT OFFICE
CERTIFICATE OF CORRECTION

Patent No. 4,700,311                         Dated    October 13, 1987

Inventor(s)     Tributsch et al

It is certified that error appears in the above-identified patent and that said Letters Patent are hereby corrected as shown below:

Title page:

The name of the Assignee should read as follows: Hahn-Meitner-Institut Berlin GmbH.

Signed and Sealed this

Nineteenth Day of April, 1988

*Attest:*

DONALD J. QUIGG

*Attesting Officer*    *Commissioner of Patents and Trademarks*